United States Patent [19]
Perillo et al.

[11] Patent Number: 5,764,460
[45] Date of Patent: Jun. 9, 1998

[54] CIRCUIT FOR THE PROTECTION AGAINST OVERCURRENTS IN POWER ELECTRONIC DEVICES AND CORRESPONDING METHOD

[75] Inventors: Leonardo Perillo, Palo del Colle; Giuseppe Scilla, Pedara, both of Italy

[73] Assignee: Co.Ri.M.Me-Consorzio per la Ricerca sulla Microelettronica nel Mezzogiorno, Catania, Italy

[21] Appl. No.: 771,539

[22] Filed: Dec. 23, 1996

[30] Foreign Application Priority Data

Dec. 29, 1995 [EP] European Pat. Off. ............ 95830557

[51] Int. Cl.[6] ........................................ H02H 7/00
[52] U.S. Cl. ................... 361/18; 361/79; 361/86; 361/97; 323/277
[58] Field of Search ................... 361/18, 79, 86, 361/93, 97, 100, 101; 323/276, 277

[56] References Cited

U.S. PATENT DOCUMENTS

| | | | |
|---|---|---|---|
| 5,025,203 | 6/1991 | Edwards | 323/268 |
| 5,091,818 | 2/1992 | Morikawa et al. | 361/56 |
| 5,210,481 | 5/1993 | Brambilla et al. | 323/316 |

FOREIGN PATENT DOCUMENTS

| | | |
|---|---|---|
| 0501418 | 9/1992 | European Pat. Off. |
| 0580921 | 2/1994 | European Pat. Off. |
| 2030808 | 4/1980 | United Kingdom |
| 2042297 | 9/1980 | United Kingdom |
| 229054 | 9/1990 | United Kingdom |

*Primary Examiner*—Jeffrey A. Gaffin
*Assistant Examiner*—Michael J. Sherry
*Attorney, Agent, or Firm*—Allen, Dyer, Doppelt, Milbrath & Gilchrist, P.A.

[57] ABSTRACT

A circuit for protecting from overload currents includes an electronic power device having at least first and second terminals and at least one control terminal. The circuit also includes at least one voltage-generating circuit for generating a reference voltage having a predetermined pattern. The voltage-generating circuit includes at least a first terminal connected to the first terminal of the power device and at least a second terminal coupled to the second terminal of the power device through a sensor. The circuit also preferably includes at least one comparator for comparing the reference voltage with a voltage present across the sensor. The comparator has at least one output terminal and at least first and second input terminals. The first and second input terminals are respectively connected to a third terminal of the voltage-generating circuit and the second terminal of the power device. The circuit also includes at least one current limiter having at least a first terminal connected to the control terminal of the power device, at least a second terminal connected to the second terminal of the voltage-generating circuit, and at least one control terminal connected to the output terminal of the comparator.

20 Claims, 5 Drawing Sheets

CIRCUIT FOR THE PROTECTION AGAINST OVERCURRENTS IN POWER ELECTRONIC DEVICES AND CORRESPONDING METHOD

FIELD OF THE INVENTION

This invention relates to a circuit for protecting electronic power devices from overload currents and also to a method of protecting electronic power devices from overload currents.

BACKGROUND OF THE INVENTION

Figure 1:
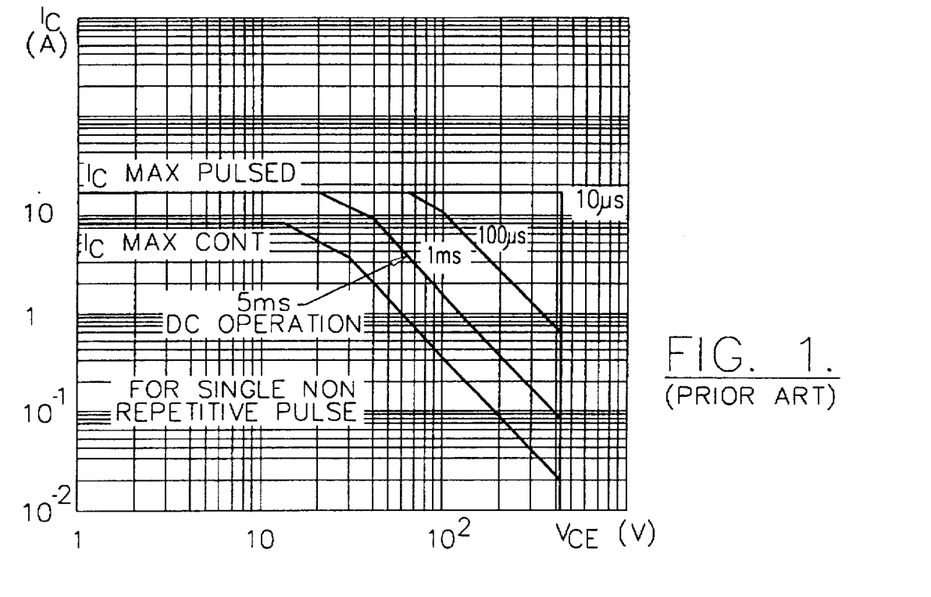
FIGS. 1 and 2 are respective plottings of the characteristic curves for a voltage regulator as in the prior art.

The invention is particularly related to all those circuit applications, such as voltage regulators of either the positive or the negative type, which utilize electronic power devices requiring effective limitation of their maximum dissipatable power and collector current in the "second breakdown" area. As is known, so-called SOA (Safe Operating Area) circuits have been used to protect such power devices. In particular, a SOA protection circuit incorporated in a voltage regulator has the task of controlling, under all load conditions of the regulator, the working point (Ic, Vce) of the power device therein to be within a safe area called FBSOA (Forward Bias Safe Operating Area), as shown in FIG. 1 and as peculiar to individual devices.

Figure 2:
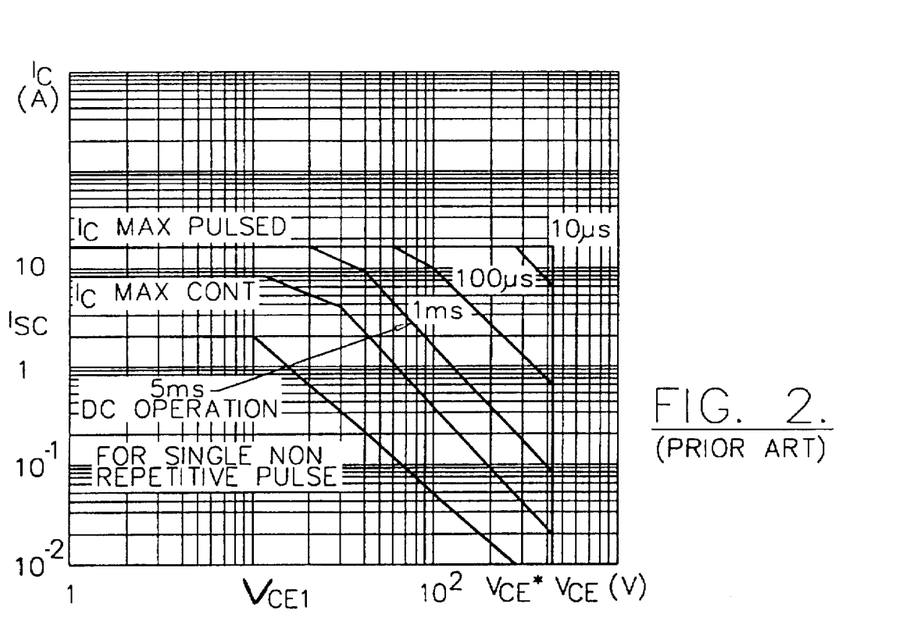

As the working point of the power device tends to move out of its FBSOA for whatever reason, such as a short circuit or an overload current combined with a high voltage supply to the regulator, the protection circuit is operated to keep the output current from the power device within a safe range. Plotted in FIG. 2 is an operation curve for a typical SOA protection circuit. As can be seen, this curve has an initial segment where the maximum current that can be output by the power device is independent of the value attained by a voltage Vce across the device. This current is equal to a short circuit current Isc whose value is set at the designing stage.

As shown in FIG. 2, the operation curve for the protection circuit, after reaching a predetermined voltage value which corresponds to Vce=Vce1, takes a negative slope to proportionately lower the maximum output current of the power device as the voltage Vce rises. In this way, device destruction can be avoided by virtue of the device delivering a maximum power which decreases as the voltage Vce rises.

Also with reference to FIG. 2, the point on the protection circuit operation curve which corresponds to a value of Vce=Vce* represents the voltage limit beyond which the power device will output no current (latch-down condition). It should be noted that the slope of said operation curve is set by both the value of the short circuit current Isc and the power device maximum dissipable power, with an ample safe margin on the limiting values imposed by the FBSOA. In this way, variations in the parameters that govern the integration process of the protection circuit are prevented from bringing the operation curve of the circuit past the limits of the FBSOA and causing the power device to break down.

Figure 3:
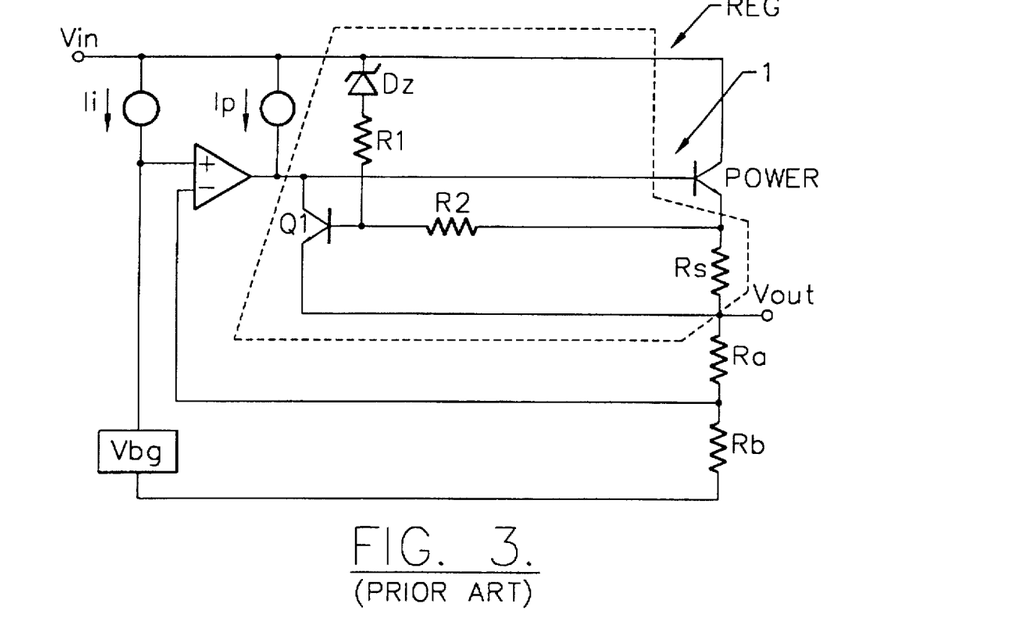
FIG. 3 shows schematically a circuit diagram for a voltage regulator which includes a prior art protection circuit.

Shown in FIG. 3 is a known technical solution providing for the use of a protection circuit 1 incorporated into a voltage regulator REG. In particular, the voltage regulator REG has input and output terminals across which first and second terminals of an electronic power device POWER are connected. This device also has a control terminal which is coupled to the input terminal of the voltage regulator REG through a current generator Ip.

Again with reference to FIG. 3, the protection circuit 1 includes a transistor Q1 of the bipolar type which has a first terminal connected to the control terminal of the power device POWER and a second terminal connected to the output terminal of the regulator REG. The transistor Q1 also has a control terminal which is coupled to the input terminal of the regulator REG through a circuit leg 2 which includes a first resistive element R1 connected serially to a diode Dz of the zener type. The control terminal of this transistor Q1 is also coupled, through a second resistive element R2, to the second terminal of the power device POWER. The protection circuit 1 further comprises a third resistive element Rs, such as a sensor, connected between the second terminal of the power device POWER and the output terminal of the voltage regulator REG.

The operation of the protection circuit 1 will now be described with reference to an initial state in which:

$$Vin - Vout < Vz$$

where, Vin is a voltage present at the input terminal of the regulator REG, Vout is a voltage present at the output terminal of the regulator, and Vz is a voltage present across the diode Dz. In this case, the diode Dz is cut off, so that the circuit leg 2 will be inactive.

The transistor Q1, which actuates the protection feature, also is cut off until a voltage Vrs across the third resistive element Rs reaches a value Vbeon representing the voltage value beyond which the transistor Q1 would be conducting. The third resistive element Rs is sized such that, when a current Isc equal to the maximum admitted short circuit current is flowed therethrough, a voltage equal to Vbeon appears across it, namely: Vbeon=Rs*Isc.

As the transistor Q1 begins conducting, it starts to draw current from the current generator Ip driving the power device POWER, so that this device will have the oncoming current to its control terminal limited. In addition, because of the exponential relation that ties the voltage present between the control terminal and the second terminal of the transistor Q1 to the current being flowed through the first terminal of this transistor, a control loop is created which limits the current to be output from the power device POWER to a value equal to the current Isc. Since the latter is independent of the voltage Vce, the protection circuit will operate within that area of the operation curve of FIG. 2 which corresponds to the constant current segment.

On the other hand, if the condition Vin−Vout>Vz is met, then the diode Dz begins to conduct, so that the operation of the transistor Q1 will be regulated not only by the current Isc but also by the value of the voltage Vin−Vout, which is practically coincident with the voltage Vce. Therefore, $$Vbeq1 = Rs*Isc + (Vin - Vout - Vz)*(R2/(R1+R2+Rs)) \quad (1)$$

and since R1>R2+Rs and Vin−Vout=Vce, $$Vbeq1 = Rs*Isc + (Vce - Vz)*R2/R1. \quad (2)$$

It follows from (2) above that the voltage Vbeq1 increases with the voltage Vce and, therefore, that the current to be output by the power device POWER is proportionately less as the voltage Vce increases, due to the presence of the control loop. By differentiating the formula (2) with respect to the voltage Vce, the following is obtained:

$$d(Isc)/d(Vce) = -R2/(R1*Rs) \quad (3)$$

since d(Vbeq1)/d(Vce)≅0 and d(Vz)/d(Vce)=0.

Relation (3) above gives the slope, obviously a negative one, of the operation curve for the protection circuit 1 within values of the voltage Vce which range from Vce1 to Vce*, as shown in FIG. 2. The formula (3) also shows that a weak point of the protection circuit 1 just described is due to the slope of its operation curve being dependent on both the ratio of R2 to R1, and therefore their proper match on silicon, and the absolute value of Rs.

Considering typical values adopted for such resistive elements, e.g. R1=30 kΩ, R2=300Ω, Rs=0.3Ω, it can be seen that the match of the resistive elements R1 and R2 on silicon becomes problematical because they differ in both magnitude and diffusion type. It has been found that the integration of these resistive elements on silicon brings about a large variation in the actual value of the ratio R1/R2 compared to the designed nominal value. This implies that the slope of the operation curve will pass the limits allowed by the FBSOA, with attendant breakdown of the power device.

Furthermore, the effect of a variation of about ±30% in the value of the resistive element Rs (as formed by a diffusion of the N++ type) during its diffusion process, which variation reflects on both the slope of the operation curve and the value of the current Isc, should be taken into consideration. A possible safeguard from such errors introduced by the integration process for the protection circuit 1 is that of keeping well within the FBSOA, but this would lead to the aforementioned latch-down situation for high values of the voltage Vce, and the problem of matching the resistive elements would not be fully solved.

Finally, there remain two unfavorable aspects for further consideration. A first aspect is the dependence of the operation curve on the junction temperature of the power device POWER. To enhance the reliable operation of the power device, in fact, it is desirable that the operation curve has a slightly negative coefficient with temperature. This means that the area of maximum dissipation that the device can be allowed must be reduced proportionately as the device temperature increases. This is difficult to achieve using the protection device 1, because the positive coefficient with temperature of the current Ip is to be taken into account and which is not easily compensated for by the positive temperature coefficient of the current draw by the transistor Q1.

The second unfavorable aspect of the protection circuit 1 is that it adversely affects the drop-out voltage of the regulator REG due to the presence of the resistive element Rs in series with the second terminal of the power device POWER.

SUMMARY OF THE INVENTION

The underlying technical problem of this invention is to provide a protection circuit which has constructional and functional features effective to overcome the limitations and/or drawbacks mentioned above in connection with the state of the art.

More particularly, the invention is directed to a protection circuit for protecting from overload currents an electronic power device comprising at least first and second terminals and at least one control terminal. The protection circuit preferably comprises voltage-generating circuit means for generating a reference voltage having a predetermined pattern, and wherein the voltage-generating circuit means comprising first, second and third terminals with the first terminal connected to the first terminal of the power device and the second terminal connected to the second terminal of the power device through a sensor. The protection also preferably further includes a comparator for comparing the reference voltage with a voltage present across the sensor, and wherein the comparator preferably comprises an output terminal and first and second input terminals with the first and second input terminals being respectively connected to the third terminal of the voltage-generating circuit means and the second terminal of the power device. The circuit also preferably includes a current limiter comprising a first terminal connected to the control terminal of the power device, a second terminal connected to the second terminal of the voltage-generating circuit means, and a control terminal connected to the output terminal of the comparator.

The voltage-generating circuit means may further comprise means for generating the reference voltage having the predetermined pattern to include a first segment of zero slope. In addition, the voltage-generating circuit means may also include means for generating the reference voltage having the predetermined pattern to include a second segment of constant negative slope. The predetermined pattern may also include at third segment of zero slope, such as having a non-zero value.

BRIEF DESCRIPTION OF THE DRAWINGS

A better understanding of the features and advantages of the inventive circuit can be gained from the following description of an embodiment thereof, given by way of example and not of limitation with reference to the accompanying drawings. In the drawings.

DETAILED DESCRIPTION OF THE PREFERRED EMBODIMENTS

Figure 4:
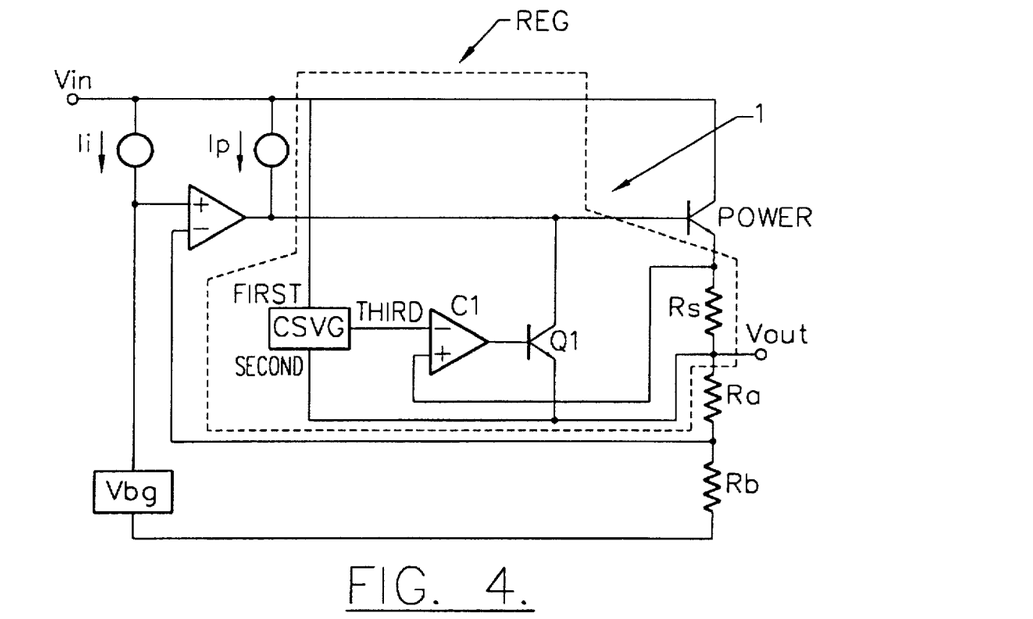
FIG. 4 shows schematically a circuit diagram for a voltage regulator which includes a protection circuit according to this invention.

Referring to the drawing figures, generally and schematically shown at 1 is a circuit for protecting an electronic power device against current overloads. Referring to FIG. 4, the protection circuit 1 is incorporated into a voltage regulator REG which has an input terminal and an output terminal across which first and second terminals of an electronic power device POWER are connected.

The device POWER also has a control terminal coupled to the input terminal of the voltage regulator REG through a first current generator Ip. Specifically, the protection circuit 1 includes at least one voltage-generating circuit means CSVG which generates a reference voltage Vref having a predetermined pattern. This voltage-generating circuit means CSVG has a first terminal connected to the first terminal of the power device POWER and a second terminal which is coupled to the second terminal of the power device through a sensor Rs.

Again with reference to FIG. 4, the protection circuit 1 further includes an error comparator C1 for comparing the reference voltage Vref to a voltage Vrs present across the sensor Rs. This error comparator C1 has an output terminal and first and second input terminals, the latter being respectively connected to a third terminal of the voltage-generating circuit means CSVG and the second terminal of the power device POWER. Finally, the protection circuit 1 incorporates a current limiter Q1 having a first terminal connected to the control terminal of the power device POWER, a second terminal connected to the second terminal of the voltage-generating circuit means CSVG, and a control terminal connected to the output terminal of the comparator C1.

Figure 5:
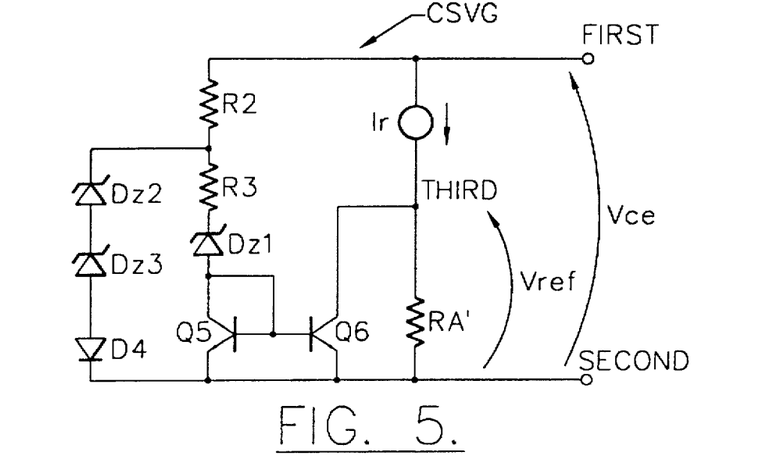
FIG. 5 shows a first embodiment of the protection circuit in FIG. 4.

Specifically, with reference to FIG. 5, the voltage-generating circuit means CSVG incorporates a current mirror (Q5, Q6), formed of a first transistor Q5 and a second Q6 transistor, which has an input leg coupled to the first terminal of the circuit means CSVG through a first circuit leg 2. In particular, this first circuit leg 2 includes first R2 and second R3 resistive elements connected in series with each other and to a first zener diode Dz1.

The current mirror (Q5, Q6) also includes an output leg connected to the third terminal of the circuit means CSVG. This output leg is also coupled to the first and second terminals of the circuit means CSVG through a third resistive element RA' and a second current generator Ir, respectively.

The circuit means CSVG also has a second circuit leg 3 connected between its second terminal and an intermediate node A provided between the first R2 and second R3 resistive elements. This second circuit leg 3 includes second Dz2 and third Dz3 zener diodes, and a fourth diode D4 of the junction type, connected serially together.

Figure 6:
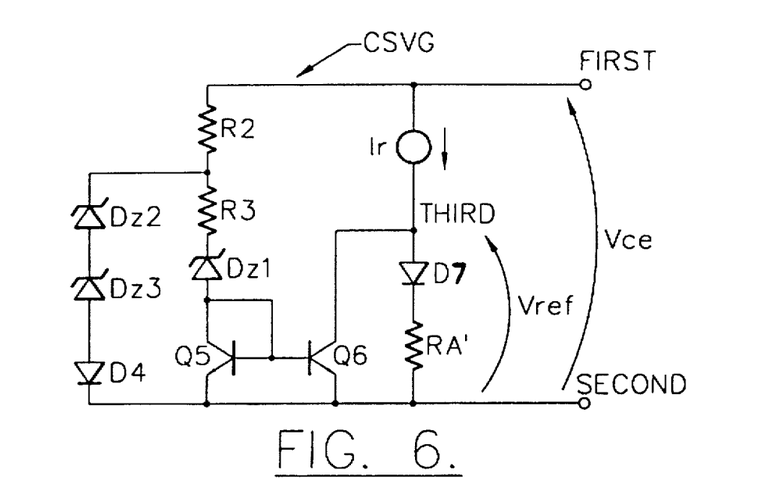
FIG. 6 shows a second embodiment of the protection circuit in FIG. 4.

Shown in FIG. 6 is a second embodiment of the voltage-generating circuit means CSVG' which has a fifth diode D7 of the junction type in series with the third resistive element RA'.

The operation of the protection circuit 1 according to the invention will now be described with reference, in particular, to FIG. 5 and an initial state in which Vce<Vz where, Vce is a voltage present across the first and second terminals of the voltage-generating circuit means CSVG, also corresponding to the voltage present across the power device POWER, and Vz is a common voltage at the diodes Dz1, Dz2, Dz3.

In this case, the diodes Dz1, Dz2, Dz3 and the diode D4 are cut off, so that the current mirror (Q5, Q6) will be inactive. Consequently, the voltage Vref generated by the circuit means CSVG and present across the third resistive element RA' is only due to a current Ir generated by the second current generator Ir. As explained hereinafter, this current Ir is functionally dependent on a thermal voltage Vt and a voltage Vbe relating to a transistor included in the regulator REG, namely $$Ir = K^* Vt/R1 + Vbe/R4 \quad (4)$$

It can be seen from formula (4) that the current Ir is independent of the voltage Vce, and that its temperature coefficient is a negative one. The last-mentioned condition is governed by the temperature characteristic to be conferred on the protection circuit 1. In fact, the operation curve of this circuit is usually set with a negative thermal drift.

From formula (1), it is obtained that $$Vrefn = RA'^* Ir = K^* Vt^*(RA'/R1) + Vbe^*(RA'/R4). \quad (5)$$

Figure 7:
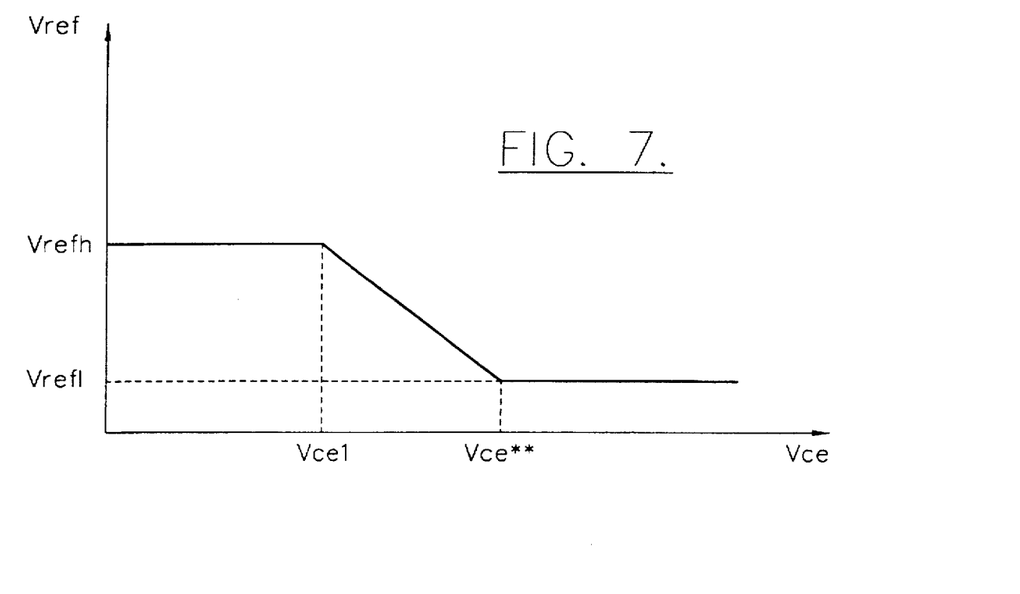
FIGS. 7 and 8 are respective graphs of electric signals present in the circuit shown in FIG. 4.
Figure 8:
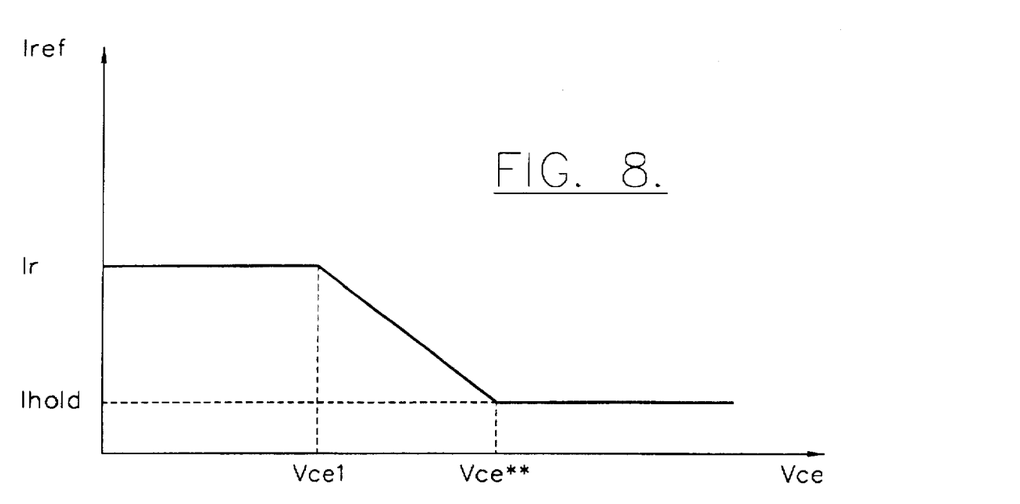

Formula (5) gives the voltage value that corresponds to the first constant voltage segment of the graph shown in FIG. 7, where the dependence of the voltage Vref on the voltage Vce is illustrated.

The instance of Vce>Vz will now be discussed. In this second case, the diode Dz1 is conducting, but the assumption is that the voltage Vce is still insufficient to activate the diodes Dz2, Dz3 and D4. Thus, the current mirror (Q5, Q6) is active, and a current I1 is flowed through its input leg which is given by $$I1 = (Vce - Vz - Vbeq5)/(R2 + R3) \quad (6)$$

where, Vbeq5 is a voltage present across the first transistor Q5.

If this voltage is ignored, the formula (6) becomes $$I1 = (Vce - Vz)/(R2 + R3).$$

The current I1 is mirrored by the output leg of the current mirror (Q5, Q6) into a current I2 given by $$I2 = (A6/A5)^*(Vce - vz)/(R2 + R3)$$

where, A5 and A6 are the transistors Q5 and Q6 areas.

This current I2 is subtracted from the current Ir, so that the net current flowing through the third resistive element RA' is given by $$Iref = Ir - I2 = K^*(Vt/R1) + (Vbe/R4) - (A6/A5)^*(Vce - Vz)/(R2 + R3).$$

Therefore, the voltage Vref across this third resistive element RA' will be given by $$Vref = K^* Vt^*(RA'/R1) + Vbe^*(RA'/R4) - (A6/A5)^*(Vce - Vz)^* RA'/(R2 + R3) \quad (7)$$

It is evinced from the above formula that as the voltage Vce increases the voltage Vref decreases until the diodes Dz2, Dz3 and D4 begin conducting. Formula (7) corresponds to the negative slope of the graph in FIG. 7.

The diodes Dz2, Dz3 and D4 begin conducting upon the current I1 satisfying the following relation:

$$R3^* I1 + Vz + Vbeq5 = 2^* Vz + Vd4$$

and since Vbeq5=Vd4, therefore $$I1 = Vz/R3 \quad (8)$$

When the diodes Dz2, Dz3 and D4 are not conducting, the following relation holds:

$$I1 = (Vce - Vz)/(R2 + R3) \quad (9)$$

By combining formulae (8) and (9) together, $$Vce^{**} = Vz^*(R2 + 2^* R3)/R3 \quad (10)$$

Formula (10) gives the value of the voltage Vce, past which the circuit leg 3 will be conducting. From this condition onwards, the voltage across the circuit leg 3 is held at a constant potential as the voltage Vce varies, so that the value of the current I1 will also be independent of this voltage.

Calling I1* this constant current value, it will meet the following condition:

$$R3*I1* + Vz + Vbeq5 = 2*Vz + Vd4$$

whence $$I1* = Vz/R3$$

Therefore, the current Iref flowing through the third resistive element RA' is given by $$Ihold = K*Vt/R1 + Vbe/R4 - (A6/A5)*Vz/R3$$

while the voltage Vref takes a constant value given by $$Vref1 = K*Vt*(RA'/R1) + Vbe*RA'/R4 - (A6/A5)*Vz(RA'/R3) \quad (11)$$

This is the corresponding voltage value to the constant-voltage end segment of the graph in FIG. 7.

The formulae which describe the behavior of the protection circuit 1 are those denoted by (5), (7), (10), (11). It is evinced from these formulae that the characteristic quantities Vrefh, Vref1, Vce1 which is equal to Vz, Vce**, and the curve slope representing the voltage Vref through the down-going segment are only dependent on resistance ratio, quantities such as the thermal voltage Vt and the zener voltage Vz, the area ratio of the two transistors Q5 and Q6, and a quantity K which is a constant. It should be further noted that the ratio A5/A6 in formulae (7) and (11), if less than unity, allows the value of the third resistive element RA' to be increased proportionately with its value with respect to the instance of the ratio being of one, leaving unchanged the value Vref1 and the slope of Vref through the down-going segment of the graph in FIG. 7.

Since the value of the third resistive element RA' is usually smaller than the values of the first R2 and second R3 resistive elements, by suitably selecting the areas A5 and A6, the value of RA' can be increased, and with it, the match of the resistive elements on the silicon can be improved. In addition, to reduce the drop-out voltage of the voltage regulator REG, it is desirable to have the value of the sensor Rs reduced as much as possible. This implies that, once the values for the currents Ir and Ihold are set, lower values will be required for Vrefh and Vref1. For example, if Ir=2.2 A and Ihold=260 mA, by setting Rs=33 mΩ, Vrefh=77 mv and Vref1=8.8 mv is obtained.

Furthermore, it is evident from the circuit diagram in FIG. 6 that it would be impossible for the voltage Vref to take such low values because it is coincident with the voltage Vce across the third transistor Q6. The last-mentioned voltage cannot drop below a value of 200 mV, which reflects the saturated condition of the transistor Q6.

In order to enable the voltage Vref to take such low values, and at the same time hold the voltage Vceq6 at values that keep this transistor away from saturation, the protection circuit 1 should be modified by the introduction of the diode D7 as shown in FIG. 7. Thus, the protection circuit of this invention eliminates the latch-down problem with which conventional SOA circuits is beset both at the regulator start-up, when the regulator is supplied high input voltages Vin and drives capacitive loads in the microfarad range, and in short circuit situations at high output voltages Vout to the capacitive load, when the voltage reference incorporated into the regulator is held off.

Figure 9:
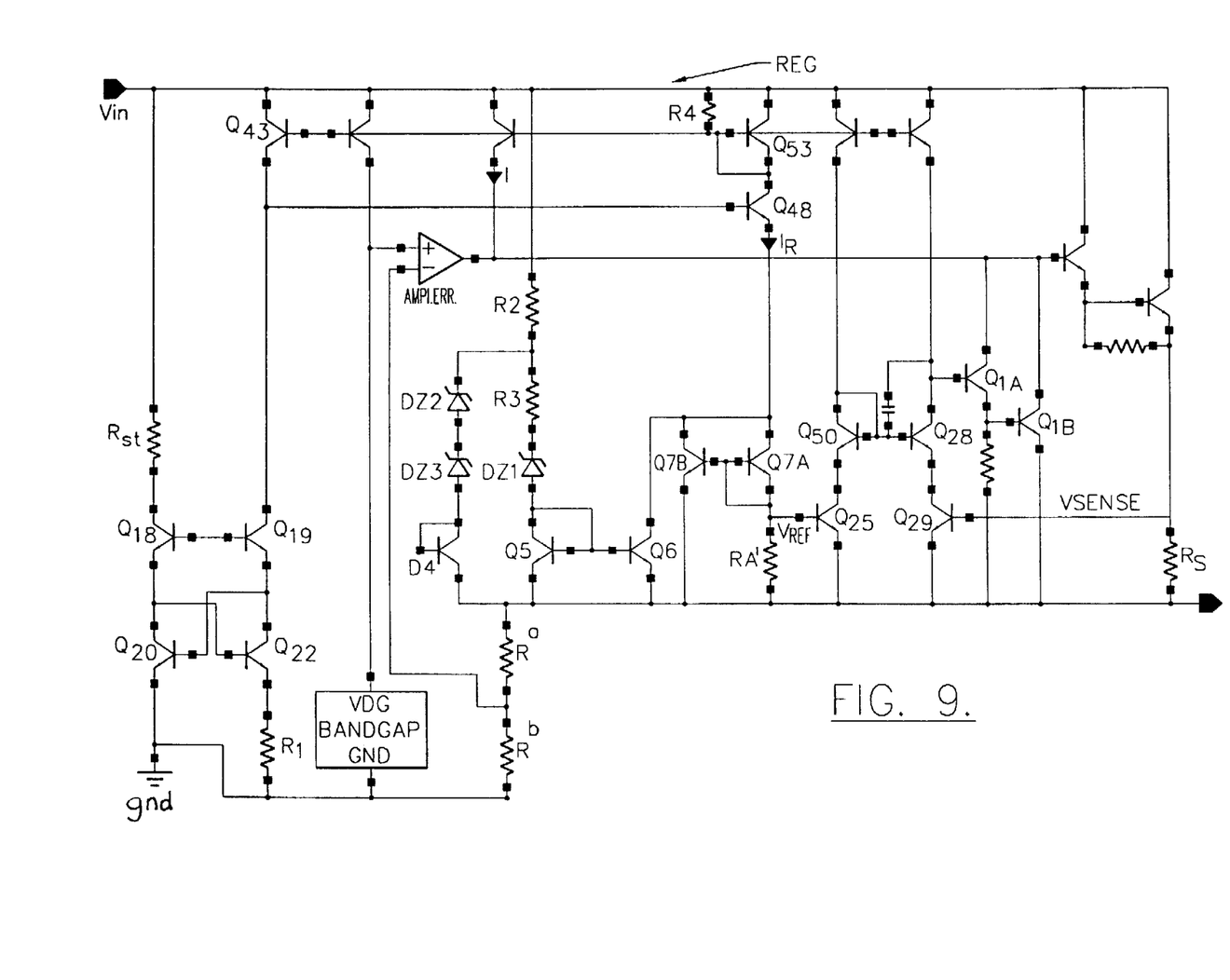
FIG. 9 is a general diagram of a voltage regulator which includes a protection circuit according to the invention.

Shown in FIG. 9 is a general circuit diagram for a voltage regulator REG of the positive type, including a protection circuit 1 according to the invention. Specifically, FIG. 9 shows, from left to right, a voltage regulator REG having a start-up stage STU which incorporates third Q17 and fourth Q18 transistors connected together into a current mirror, and in cascade with fifth Q20 and sixth Q22 transistors in cross-coupled configuration. The start-up stage STU also includes a fourth resistive element Rst connected to an input leg of the current mirror formed by the third Q18 and fourth Q19 transistors, and a fifth resistive element R1 connected in series with the sixth transistor Q22.

By applying, to the stage STU, the equations that relate the collector current Ic of a transistor to the voltage across its base and emitter terminals, the current present on an output leg of the current mirror formed by the third Q18 and fourth Q19 transistors shows to be neither dependent on the input voltage Vin to the regulator REG nor on a current flowing through the fourth resistive element Rsta, and given by $$Ic = Kc*Vt/R1$$

where, Kc is a parameter given as $$Kc = \ln(A18*A22) - \ln(A17*A20)$$

where, Vt is the thermal voltage, and A18, A22, A17, A20 are the areas of the fourth Q19, sixth Q22, third Q18 and fifth Q20 transistors, respectively.

The current Ic is then mirrored at a ratio of 1:3 to generate the current Ir through a so-called Wilson current mirror formed by seventh Q53, eighth Q48 and ninth Q43 transistors. This current mirror is used to prevent the current Ir from changing with the input voltage Vin by the Early Effect due to the seventh transistor Q53.

The regulator REG also includes a sixth resistive element R4 connected in parallel with a base-emitter junction of the seventh transistor Q53, through which a current is flowed which adds to the current Ir, namely:

$$Ir = 3*Kc*Vt/R1 + Vbeq53/R4$$

and substituting the expression for Kc, $$Ir = K*Vt/R1 + Vbeq53/R4$$

as previously described.

The need to have the current Ir dependent on both the thermal voltage Vt and the voltage Vbe originates from that, by suitably selecting the resistive elements R1 and R4, the temperature coefficient of that current can be rendered negative. This results in an operation curve which becomes flatter as temperature rises.

It can be seen in FIG. 9 that the error comparator C1 is formed by tenth Q50, eleventh Q28, twelfth Q25 and thirteenth Q29 transistors, while the current limiter Q1 is provided by a Darlington pair comprising a fourteenth and a fifteenth transistor Q1A and Q1B, respectively.

Also shown in FIG. 9 is that the fifth diode D7 (FIG. 6) comprises sixteenth Q7A and seventeenth Q7B transistors connected into a current mirror. Thus, calling A1 and A2 the areas of the sixteenth Q7A and seventeenth Q7B transistors, respectively, the effect due to these transistors and the third resistive element RA' is equivalent to a resistance given by $$RA''=RA'*(A1/(A1+A2))$$

Accordingly, the value RA" from the above formula should be substituted for the value of the third resistive element RA' in formulae (5), (7), (10), (11) that describe the behavior of the protection circuit 1.

We claim:

1. A protection circuit for protecting from overload currents an electronic power device comprising at least first and second terminals and at least one control terminal, said protection circuit comprising:

a sensor;

voltage-generating circuit means for generating a reference voltage having a predetermined pattern, said voltage-generating circuit means comprising first, second and third terminals with the first terminal connected to the first terminal of the power device and the second terminal connected to the second terminal of the power device through said sensor;

at least one comparator for comparing the reference voltage with a voltage present across said sensor, said comparator comprising at least one output terminal and at least first and second input terminals, said first and second input terminals being respectively connected to the third terminal of the voltage-generating circuit means and the second terminal of the power device; and at least one current limiter comprising at least a first terminal connected to the control terminal of the power device, at least a second terminal connected to the second terminal of the voltage-generating circuit means, and at least one control terminal connected to the output terminal of said comparator.

2. A circuit according to claim 1, wherein said voltage-generating circuit means further comprises means for generating the reference voltage having the predetermined pattern to include at least a first segment of zero slope.

3. A circuit according to claim 2, wherein said voltage-generating circuit means further comprises means for generating the reference voltage having the predetermined pattern to include at least a second segment of constant negative slope.

4. A circuit according to claim 3, wherein said voltage-generating circuit means further comprises means for generating the reference voltage having the predetermined pattern to include at least a third segment of zero slope.

5. A circuit according to claim 3, wherein said voltage-generating circuit means further comprises means for generating the reference voltage having the predetermined pattern to include at least a third segment of zero slope having a non-zero value.

6. A circuit according to claim 1, wherein said at least one comparator comprises an error comparator.

7. A voltage regulator comprising at least one input terminal and at least one output terminal;
   a current generator;
   an electronic power device comprising first and second terminals and a control terminal, the control terminal being coupled through said current generator to said at least one input terminal; and
   a protection circuit for said electronic power device comprising
   a sensor,
   voltage-generating circuit means for generating a reference voltage having a predetermined pattern, said voltage-generating circuit means comprising first, second and third terminals with the first terminal connected to the first terminal of the power device and the second terminal connected to the second terminal of the power device through said sensor, at least one comparator for comparing the reference voltage with a voltage present across said sensor, said comparator comprising at least one output terminal and at least first and second input terminals, said first and second input terminals being respectively connected to the third terminal of the voltage-generating circuit means and the second terminal of the power device, and at least one current limiter comprising at least a first terminal connected to the control terminal of the power device, at least a second terminal connected to the second terminal of the voltage-generating circuit means, and at least one control terminal connected to the output terminal of said comparator.

8. A voltage regulator according to claim 7, wherein said voltage-generating circuit means further comprises means for generating the reference voltage having the predetermined pattern to include at least a first segment of zero slope.

9. A voltage regulator according to claim 8, wherein said voltage-generating circuit means further comprises means for generating the reference voltage having the predetermined pattern to include at least a second segment of constant negative slope.

10. A voltage regulator according to claim 9, wherein said voltage-generating circuit means further comprises means for generating the reference voltage having the predetermined pattern to include at least a third segment of zero slope.

11. A voltage regulator according to claim 9, wherein said voltage-generating circuit means further comprises means for generating the reference voltage having the predetermined pattern to include at least a third segment of zero slope having a non-zero value.

12. A voltage regulator according to claim 7, wherein said at least one comparator comprises an error comparator.

13. An electronic circuit comprising:

an electronic power device comprising at least first and second terminals and at least one control terminal;

a sensor;

voltage-generating circuit means for generating a reference voltage having a predetermined pattern, said voltage-generating circuit means comprising first, second and third terminals with the first terminal connected to the first terminal of the power device and the second terminal connected to the second terminal of the power device through said sensor;

at least one comparator for comparing the reference voltage with a voltage present across said sensor, said comparator comprising at least one output terminal and at least first and second input terminals, said first and second input terminals being respectively connected to the third terminal of the voltage-generating circuit means and the second terminal of the power device;

at least one current limiter comprising at least a first terminal connected to the control terminal of the power device, at least a second terminal connected to the second terminal of the voltage-generating circuit means, and at least one control terminal connected to the output terminal of said comparator.

14. A circuit according to claim 13, wherein said voltage-generating circuit means further comprises means for generating the reference voltage having the predetermined pattern to include at least a first segment of zero slope.

15. A circuit according to claim 14, wherein said voltage-generating circuit means further comprises means for generating the reference voltage having the predetermined pattern to include at least a second segment of constant negative slope.

16. A circuit according to claim 15, wherein said voltage-generating circuit means further comprises means for generating the reference voltage having the predetermined pattern to include at least a third segment of zero slope.

17. A circuit according to claim 15, wherein said voltage-generating circuit means further comprises means for generating the reference voltage having the predetermined pattern to include at least a third segment of zero slope having a non-zero value.

18. A circuit according to claim 13, wherein said at least one comparator comprises an error comparator.

19. A method of protecting from overload currents an electronic power device comprising at least first and second terminals and at least one control terminal, said method comprises the steps of:

generating, from a voltage-generating circuit, a reference voltage having a predetermined pattern, wherein the voltage-generating circuit includes first, second and third terminals, and wherein the first terminal is connected to the first terminal of the power device and the second terminal is connected to the second terminal of the power device through the sensor;

comparing, on a compare circuit, said reference voltage with a voltage present across a sensor connected in series with the power device, wherein the comparator includes at least one output terminal and at least first and second input terminals, wherein the first and second input terminals are respectively connected to the third terminal of the voltage-generating circuit and the second terminal of the power device; and limiting, by means of a current limiter, a power device drive current based upon the voltage present across the sensor exceeding the reference voltage, wherein the current limiter includes at least a first terminal connector to the central terminal the power device, at least a second terminal connected to the second terminal of the voltage-generating circuit, and at least one central terminal connected to the output circuit of the terminal.

20. A method according to claim 19, wherein the step of generating comprises generating the reference voltage dependent on a pattern of a voltage present across the first and second terminals of the power device.

* * * * *